US011194087B1

(12) United States Patent
Greif et al.

(10) Patent No.: US 11,194,087 B1
(45) Date of Patent: Dec. 7, 2021

(54) INTEGRATED WAVEGUIDE COUPLER AND LIGHT SOURCE

(71) Applicant: Facebook Technologies, LLC, Menlo Park, CA (US)

(72) Inventors: Daniel Guenther Greif, Redmond, WA (US); Scott Charles McEldowney, Redmond, WA (US); Chadwick Brian Martin, Kirkland, WA (US); Stephen James McNally, Sammamish, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 73 days.

(21) Appl. No.: 16/407,909

(22) Filed: May 9, 2019

Related U.S. Application Data

(60) Provisional application No. 62/825,138, filed on Mar. 28, 2019.

(51) Int. Cl.
| | |
|---|---|
| *F21V 8/00* | (2006.01) |
| *H01S 5/125* | (2006.01) |
| *H01L 33/60* | (2010.01) |
| *G02B 26/08* | (2006.01) |
| *H01L 33/00* | (2010.01) |
| *H01L 33/58* | (2010.01) |
| *G02B 26/10* | (2006.01) |

(52) U.S. Cl.
CPC ....... *G02B 6/0035* (2013.01); *G02B 26/0833* (2013.01); *H01L 33/0045* (2013.01); *H01L 33/58* (2013.01); *H01L 33/60* (2013.01); *H01S 5/125* (2013.01); *G02B 26/105* (2013.01)

(58) Field of Classification Search
CPC ... G02B 6/4228; G02B 6/4214; G02B 6/0035
See application file for complete search history.

(56) References Cited

U.S. PATENT DOCUMENTS

| | | | | |
|---|---|---|---|---|
| 5,218,584 | A * | 6/1993 | Gfeller | G11B 7/0908 369/112.27 |
| 2008/0272379 | A1* | 11/2008 | Laino | G02B 27/1026 257/88 |
| 2013/0209026 | A1* | 8/2013 | Doany | G02B 6/34 385/14 |

(Continued)

*Primary Examiner* — Ryan A Lepisto
*Assistant Examiner* — Erin D Chiem
(74) *Attorney, Agent, or Firm* — Pequignot + Myers; Matthew A. Pequignot

(57) ABSTRACT

A waveguide coupler may be coupled to a multi-beam light source, such as an array of superluminescent light-emitting diodes. The waveguide coupler includes a substrate having an end facet and a surface, e.g. a top flat surface, adjoining the end facet. At least one tilted reflector is supported by the substrate. A plurality of waveguides supported by the substrate extend between the end facet and the at least one tilted reflector. The at least one tilted reflector is configured to redirect light propagating in the plurality of waveguides to the surface of the substrate. In this manner, the waveguide coupler may provide an array of surface emission points on a substrate. All the surface emission points are disposed in one plane and may be suitably configured for subsequent joint collimation for use e.g. in a scanning projector display.

14 Claims, 9 Drawing Sheets

(56) References Cited

U.S. PATENT DOCUMENTS

| | | | |
|---|---|---|---|
| 2014/0140653 A1* | 5/2014 | Brown | G02B 27/0172 |
| | | | 385/10 |
| 2014/0140654 A1* | 5/2014 | Brown | G02B 27/0172 |
| | | | 385/10 |
| 2017/0207600 A1* | 7/2017 | Klamkin | G02B 6/12002 |
| 2019/0056593 A1* | 2/2019 | Bablumyan | G02B 27/0081 |
| 2019/0179078 A1* | 6/2019 | Kuritsyn | G02B 6/422 |

* cited by examiner

INTEGRATED WAVEGUIDE COUPLER AND LIGHT SOURCE

REFERENCE TO RELATED APPLICATION

The present application claims priority from U.S. Provisional application No. 62/825,138, filed on Mar. 28, 2019 and incorporated herein by reference in its entirety.

TECHNICAL FIELD

The present disclosure relates to visual displays, and in particular to optical components and modules for a wearable display or a near-eye display.

BACKGROUND

Head-mounted displays (HMDs), near-eye displays (NEDs), and other wearable and stationary display systems can be used to present virtual scenery to a user, or to augment real scenery with dynamic information, data, or virtual objects. The virtual reality (VR) or augmented reality (AR) scenery can be three-dimensional (3D) to enhance the experience and to match virtual objects to real objects observed by the user. Eye position and gaze direction, and/or orientation of the user may be tracked in real time, and the displayed scenery may be dynamically adjusted depending on the user's head orientation and gaze direction, to provide a better experience of immersion into a simulated or augmented environment.

Light sources for wearable displays need to be compact and bright. For color displays, the light sources need to provide a multi-color output including light of red, green, and blue color channels of the image to be displayed. In a scanning wearable color display, the emitted light beams need to have well-defined spatial beam characteristics suitable for beam scanning. Different color channels of a multi-color light beam may be collimated together by a compact collimator for beam scanning over a field of view of the wearable display.

SUMMARY

In accordance with the present disclosure, there is provided a waveguide coupler including a substrate having an end facet and a surface which may adjoin the end facet. At least one tilted reflector is supported by the substrate. A plurality of waveguides is supported by the substrate. The waveguides extend between the end facet and the at least one tilted reflector. The at least one tilted reflector is configured to redirect light propagating in the plurality of waveguides to the surface of the substrate. The at least one tilted reflector may include a tilted Bragg grating, and may be integrated into the substrate. The at least one tilted reflector may be coupled to a slanted facet of the substrate.

In some embodiments, the waveguide coupler further includes a plurality of output couplers supported by the surface of the substrate, each for collimating light propagated in a waveguide of the plurality of waveguides and redirected by the at least one tilted reflector, and/or a plurality of input couplers at the end facet of the substrate, each for coupling light into a waveguide of the plurality of waveguides. The input/output couplers may include e.g. refractive and/or diffractive microlenses. In some embodiments, each waveguide of the plurality of waveguides has a first propagation mode at the end facet smaller than a second propagation mode at the at least one tilted reflector. The first propagation mode may have an ellipticity larger than an ellipticity of the second propagation mode.

In some embodiments, the waveguide coupler further includes a waveguide section coupled to a first waveguide of the plurality of waveguides via an evanescent coupling region for out-coupling a portion of light from the first waveguide into the waveguide section. The waveguide coupler may include a ring resonator, the waveguide section being a part of the ring resonator, and an electrode disposed proximate the coupling region for changing the portion of light out-coupled from the first waveguide into the ring resonator.

In accordance with the present disclosure, there is provided an illuminator including a light source subassembly comprising a first substrate supporting a plurality of semiconductor light sources for providing a plurality of light beams emitted at a first end facet of the first substrate, and a waveguide coupler of this disclosure optically coupled to the light source subassembly. The waveguide coupler may include a second substrate comprising a second end facet and a surface, at least one tilted reflector supported by the second substrate, and a plurality of waveguides extending between the second end facet and the at least one tilted reflector. Each waveguide of the plurality of waveguides is configured for receiving and guiding therein a light beam of the plurality of light beams at the second end facet. The at least one tilted reflector is configured to redirect the light beams propagated in the plurality of waveguides to the surface of the second substrate. The at least one tilted reflector may include at least one of a tilted mirror, a tilted Bragg grating, or a diffractive optical surface, and may be integrated into the second substrate. Each semiconductor light source of the plurality of semiconductor light sources may include at least one of: a single-mode source, a multi-mode source, or a stimulated emissive source, and may include at least one of: a superluminescent light-emitting diode, a laser diode, a vertical-cavity surface-emitting laser diode, or a light-emitting diode.

In some embodiments, the illuminator further includes a plurality of output couplers supported by the surface of the second substrate, each for collimating a light beam of the plurality of light beams propagated in a waveguide of the plurality of waveguides and redirected by the at least one tilted reflector, and/or a plurality of input couplers at the second end facet, each for coupling a light beam of the plurality of light beams emitted by a semiconductor light source into a waveguide of the plurality of waveguides. The couplers may include e.g. refractive and/or diffractive microlenses. The illuminator may further include a collimator optically coupled to the waveguide coupler and configured for receiving and collimating the plurality of light beams, and a tiltable MEMS reflector optically coupled to the collimator and configured for receiving and redirecting the plurality of light beams collimated by the collimator.

In accordance with the present disclosure, there is further provided a semiconductor light source including a substrate, at least one p-n junction waveguide or, in some embodiments, an array of p-n junction waveguides supported by the substrate for providing optical gain for light propagating in the first p-n junction waveguide, and a tilted reflector supported by the substrate and optically coupled to the p-n junction waveguide(s) and configured for directing at least a portion of the light towards a surface of the substrate. The tilted reflector may include at least one of a tilted Bragg grating or a tilted reflective surface.

BRIEF DESCRIPTION OF THE DRAWINGS

Exemplary embodiments will now be described in conjunction with the drawings, in which.

DETAILED DESCRIPTION

Figure 1:
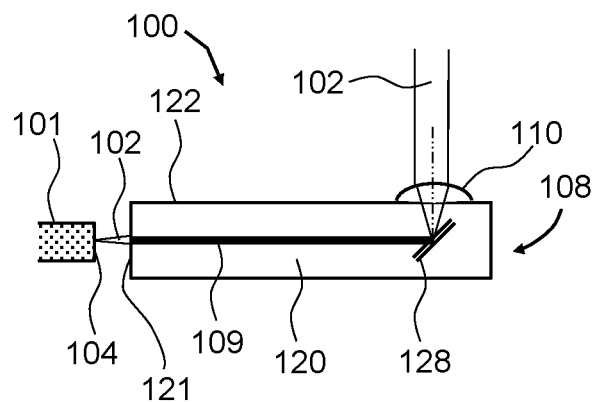
FIG. 1 is a side cross-sectional view of an illuminator having a waveguide coupler with a plurality of waveguides, an integrated reflector, and an output microlens array.

While the present teachings are described in conjunction with various embodiments and examples, it is not intended that the present teachings be limited to such embodiments. On the contrary, the present teachings encompass various alternatives and equivalents, as will be appreciated by those of skill in the art. All statements herein reciting principles, aspects, and embodiments of this disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

As used herein, the terms "first", "second", and so forth are not intended to imply sequential ordering, but rather are intended to distinguish one element from another, unless explicitly stated. Similarly, sequential ordering of method steps does not imply a sequential order of their execution, unless explicitly stated. In FIG. 1 to FIG. 8, similar reference numerals denote similar elements.

A semiconductor light source array may be used as a light source for a wearable display and its modules. Collimating light beams emitted by such a light source may be a challenging task in view of emitted beam characteristics. Multiple offset light beams may be emitted at an angle to the emitting surface and with different beam aspect ratios. In accordance with the present disclosure, a waveguide coupler may be used to provide surface emission points of a well-defined geometry disposed e.g. on a top surface of the coupler. Furthermore, other optical elements can be integrated on the coupler, e.g. ring resonator attenuators/switches/etc. In some embodiments, superluminescent light-emitting diodes (SLEDs) may be equipped with tilted diffractive reflectors to provide an output light beam emitted from the top surface of a SLED chip.

Referring to FIG. 1, an illuminator 100 includes a side-emitting semiconductor light source 101 emitting a plurality of light beams 102 at an output facet 104. The light beams 102 are received by a waveguide coupler 108. The waveguide coupler 108 includes a substrate 120 having an end facet 121 and a top surface 122 that may adjoin the end facet 121, a tilted reflector 128 integrated into the substrate 120, and a plurality of waveguides 109 extending between the end facet 121 and the tilted reflector 128. Each light beam 102 is received by a corresponding waveguide 109 at the end facet 121, and is guided by the waveguide 109 to the tilted reflector 128. The tilted reflector 128 is configured to redirect the light propagating in the plurality of waveguides 109 to the top surface 122 of the substrate 120. A plurality of output microlenses 110 collimate the light beams 102 propagated in the plurality of waveguides 109 and redirected by the tilted reflector 128. Each output microlens 110 collimates light 102 guided by a corresponding waveguide 109. The light beams 102 collimated by the plurality of output microlenses 110 are emitted from the top surface 122 of the substrate 120.

By way of non-limiting examples, the tilted reflector 128 may include an integrated mirror, a tilted Bragg grating, or a diffractive optical surface. Herein, the term "tilted Bragg grating" means a Bragg grating including fringes configured for reflecting a light beam at an angle, similarly to a tilted mirror. A separate mirror or Bragg grating may be provided for each waveguide 109. The output microlenses 110 may be a separate array of microlenses, or may be formed in/integrated with the substrate 120. An array of couplers having optical (focusing) power, e.g. diffractive optical elements and/or phase plates, may be provided instead of, or in addition to, the array of microlenses 110.

The side-emitting semiconductor light source 101 may include a plurality of single-mode emitters, multimode emitters, and/or stimulated emissive sources. A surface-emitting light source, such as a vertical-cavity surface-emitting laser diode, may also be used. The semiconductor structures of the light source may include at least one of a superluminescent light-emitting diode, a laser diode, a vertical-cavity surface-emitting laser diode, or a light-emitting diode, for example.

Figure 2:
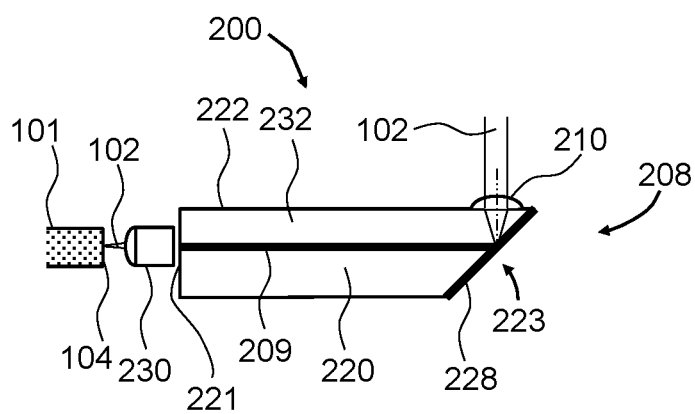
FIG. 2 is a side cross-sectional view of an illuminator having a waveguide coupler with a plurality of waveguides, an input microlens array, an edge reflector, a top spacer, and an output microlens array.

Referring to FIG. 2, an illuminator 200 includes the side-emitting semiconductor light source 101 emitting the plurality of light beams 102 at the output facet 104. The light beams 102 are received by a plurality of input microlenses 230, which couple the light beams 102 to a waveguide coupler 208. An array of couplers having optical (focusing) power, e.g. diffractive optical elements and/or phase plates, may be provided instead of, or in addition to, the plurality of input microlenses 230. The waveguide coupler 208 includes a substrate 220 having an end facet 221, an end reflector 228 coupled to a slanted rear side, or rear facet 223 of the substrate 220, and a plurality of waveguides 209 supported by the substrate 220 and running from the end facet 221 to the end reflector 228. A top spacer 232 is disposed on the substrate 220 over the plurality of waveguides 209. The top spacer 232 has a top surface 222.

Each light beam 102 is received by a corresponding input microlens 230, which refocuses the light beam 102 into a corresponding particular waveguide 209. Then, each light beam 102 is guided by the waveguides 209 to the end reflector 228. The end reflector 228 is configured to redirect the light propagating in the plurality of waveguides 209 through the top spacer 232 to its top surface 222. In some embodiments, the end reflector 228 may include a coated surface, a polished surface, or a separate reflector attached to a tilted end facet. A plurality of output microlenses 210 disposed on the top surface 222 of the top spacer 232 collimate the light beams 102 propagated in the waveguide 209 and redirected by the end reflector 228. Each output microlens 210 collimates the light beam 102 guided by a corresponding waveguide 209. The light beams 102 collimated by the plurality of output microlenses 210 are emitted from the top surface 222 of the top spacer 232. The input microlenses 230 and/or the output microlenses 210 may be a separate array of microlenses, or may be formed in and/or integrated with the substrate 220. An array of couplers having optical (focusing) power, such as diffractive optical elements and/or phase plates, may be provided instead of, or in addition to, the input microlenses 210 and/or output microlenses 230.

Figure 3:
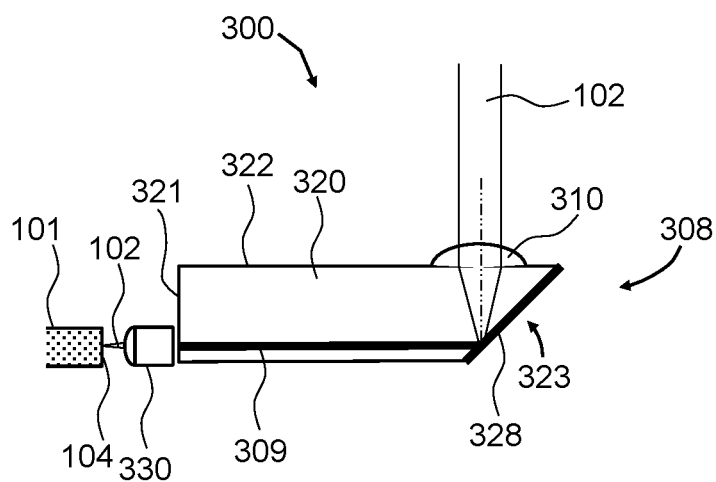
FIG. 3 is a side cross-sectional view of an illuminator having a waveguide coupler with a plurality of waveguides, an input microlens array, an edge reflector for reflecting light through the substrate, and an output microlens array.

Turning to FIG. 3, an illuminator 300 includes the side-emitting semiconductor light source 101 emitting the plurality of light beams 102 at the output facet 104. The light beams 102 are received by a plurality of input microlenses 330, which couple the light beams 102 to a waveguide coupler 308. The waveguide coupler 308 includes a substrate 320 having an end facet 321, an end reflector 328 coupled to a slanted rear side, or rear facet 323 of the substrate 320, and a plurality of waveguides 309 supported by the substrate 320 and running from the end facet 221 to the end reflector 328. The substrate 320 is "flipped" i.e. the waveguides 309 are running at the bottom of the substrate 320, as shown. Each light beam 102 is received by a corresponding input microlens 330, which refocuses the light beam 102 into a corresponding waveguide 309. Then, each light beam 102 is guided by the waveguide 309 to the end reflector 328. The end reflector 328 is configured to redirect the light propagating in the plurality of waveguides 309 upwards through the thickness of the substrate 320, towards its back surface 322 adjoining the end facet 321.

A plurality of output microlenses 310 may be disposed on the back surface 322 of the substrate 320. The output microlenses 310 collimate light 102 propagated in the waveguide 309 and redirected by the end reflector 328. Each output microlens 310 collimates light 102 guided by a corresponding waveguide 309. The light 102 collimated by the plurality of output microlenses 310 is emitted from the back surface 322 of the substrate 320. The input microlenses 330 and/or the output microlenses 310 may be a separate array of microlenses, or may be formed in and/or integrated with the substrate 320. In some embodiments of the above couplers, the reflectors 128, 228, and 328 may be omitted, and the waveguides 109, 209 and/or 309 may extend to a second facet, at which an array of output microlenses may be disposed for collimating the output light beam 102.

Figure 4:
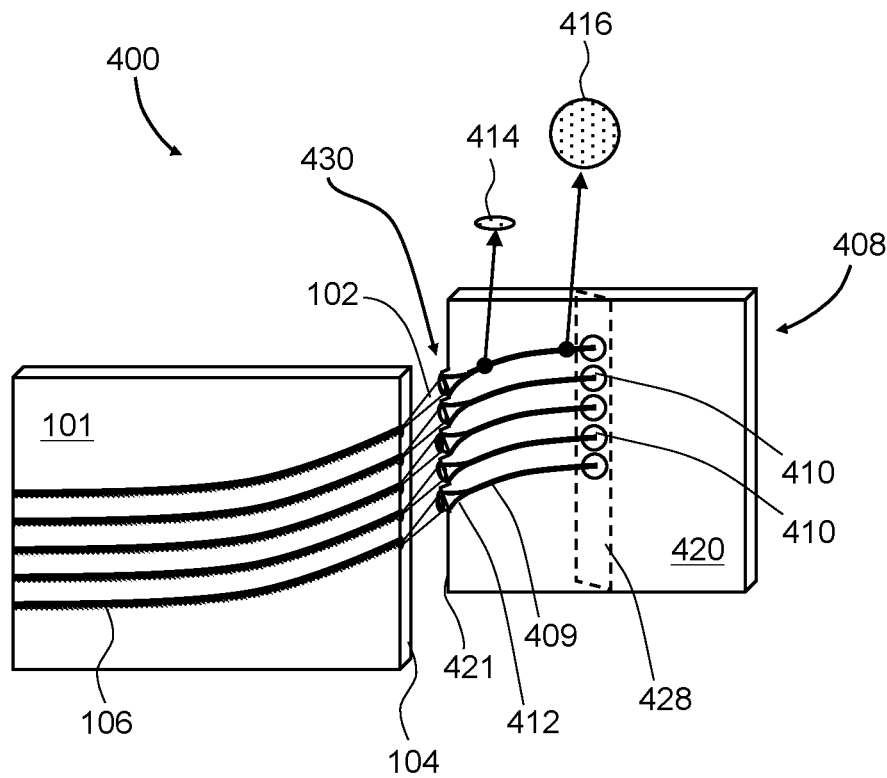
FIG. 4 is a plan view of an illuminator including a superluminescent light-emitting diode (SLED) array coupled to a waveguide coupler including an integrated reflector.

Referring to FIG. 4, an illuminator 400 includes the side-emitting semiconductor light source 101. An array of SLEDs of the side-emitting semiconductor light source 101 emits the plurality of light beams 102 at the output facet 104. To reduce backreflection, waveguides 106 of individual SLEDs of the array may be disposed at an acute angle to the output facet 104, i.e. not perpendicular to the output facet 104. A waveguide coupler 408 includes a substrate 420 supporting an array of waveguides 409, and an array of input microlenses 430 at an end facet 421 of the substrate 420 for coupling the light beams 102 to the corresponding waveguides 409. The light beams 102 can enter the waveguide coupler 408 either straight or at an acute angle into the waveguide coupler 408. The waveguides 409 may include single-mode or multimode waveguides. Each waveguide 409 runs from the corresponding input microlens 430 to a tilted reflector 428. The waveguides 409 may be straight, curvy, and may have different lengths and/or radiae of curvature. Each waveguide 409 may include a taper 412 for converting a small elliptical or round mode 414, corresponding to an emission mode of the side-emitting semiconductor light source 101, into a larger in size, and, if applicable, more round (i.e. having a smaller ellipticity) propagation mode 416 at the tilted reflector 428.

An array of output microlenses 410 may be provided to collimate the emitted light beams 102. Each output microlens 410 may have a clear aperture large enough to accept the round propagation mode 416. A single tilted reflector 428 may be replaced with a plurality of tilted reflectors, each for one particular waveguide 409. Individual tilted reflectors may be disposed and sized for accommodating the corresponding propagation modes 416. The tilted reflectors and the output microlenses 410 may, but do not have to, be disposed in a straight line as shown. For example, the tilted reflectors and the output microlenses 410 may be disposed in a rectangular, rhombic, hexagonal pattern, etc.

Figure 5:
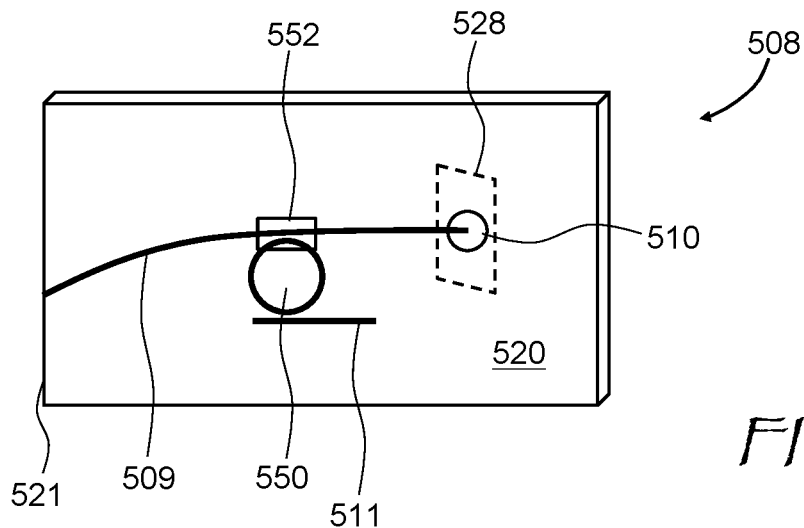
FIG. 5 is a plan view of a waveguide coupler including an integrated ring resonator.

Referring to FIG. 5, a waveguide coupler 508 includes a substrate 520 supporting at least one waveguide 509 extending between an input facet 521 and an integrated tilted reflector 528 such as a mirror or a tilted Bragg grating. A refractive and/or diffractive microlens 510 is provided over the waveguide 509 for collimating output light beam. A ring resonator 550 may be evanescently coupled to the waveguide 509. An electrode 552 may be provided in the proximity to the coupling region between the waveguide 509 and a waveguide section of the ring resonator 550 at the coupling region, for controlling evanescent optical coupling of the guided light beam from the waveguide 509 into the ring resonator 550. The electrode 552 may be coupled to a resistive heater for applying a controlled amount of heating to the coupling region for inducing a thermal change of an index of refraction and thus changing the coupling coefficient of the coupling region, and changing a portion of the out-coupled light. Other effects, such as electro-absorption, may also be used for this purpose. This and other configurations may provide a controlled attenuation of the light beam propagating in the waveguide 509, and/or switching of the light beam into a second waveguide 511.

Figure 6A:
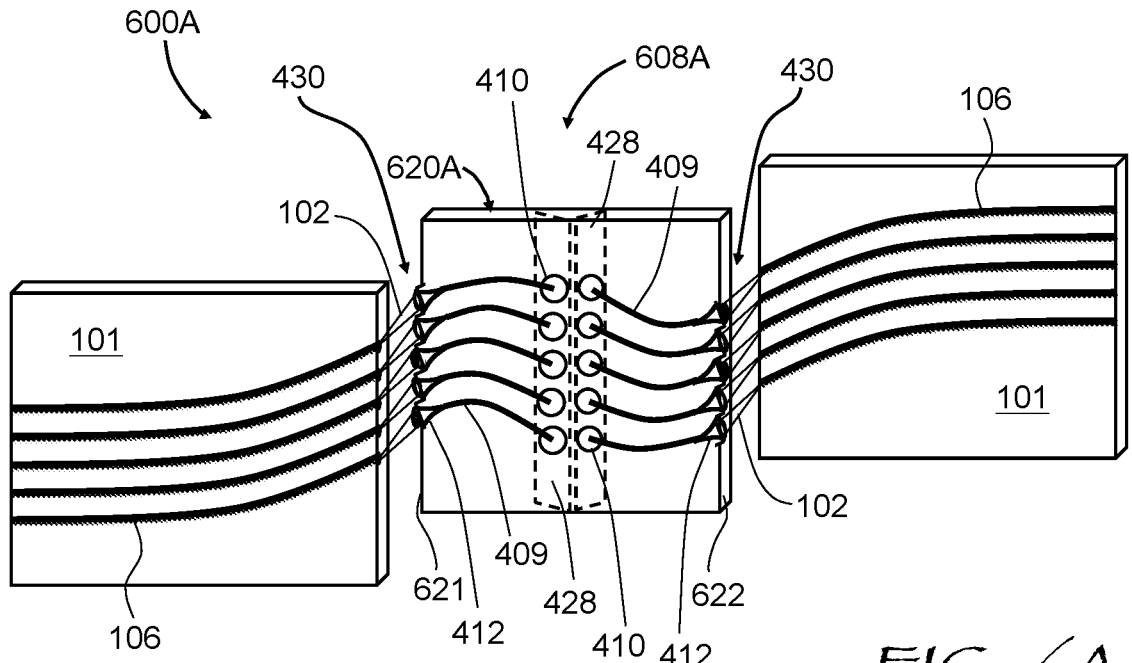
FIG. 6A is a plan view an illuminator with a pair of SLED arrays of FIG. 4 coupled to a waveguide coupler including integrated reflectors.

Referring now to FIG. 6A, an illuminator 600A includes a light source subassembly including a pair of SLED arrays 101 coupled to a waveguide coupler 608A, which has two waveguide couplers 408 of FIG. 4 integrated on a common substrate 620A. Specifically, the waveguide coupler 608A includes two arrays of waveguides 409, two arrays of input microlenses 430 at opposed end facets 621 and 622 of the substrate 620 for coupling the light beams 102 to the corresponding waveguides 409. Each waveguide 409 runs from a corresponding input microlens 430 to one of the two tilted reflectors 428. Each waveguide 409 may include the taper 412. Two arrays of output microlenses 410 may be provided to collimate the emitted light beams 102. The waveguides 409 may form an acute angle with the opposed end facets 621 and 622 to lessen angular misalignment coupling loss of coupling the tilted light beams 102. The waveguides 409 may include single-mode or multimode waveguides. Individual reflectors may be provided for each waveguide 409 instead of the common reflectors 428. The arrays of output microlenses 410 may form a linear grid, a rectangular grid, a hexagonal grid, etc. The input microlenses 430 and/or the output microlenses 410 may be refractive, diffractive, etc.

Figure 6B:
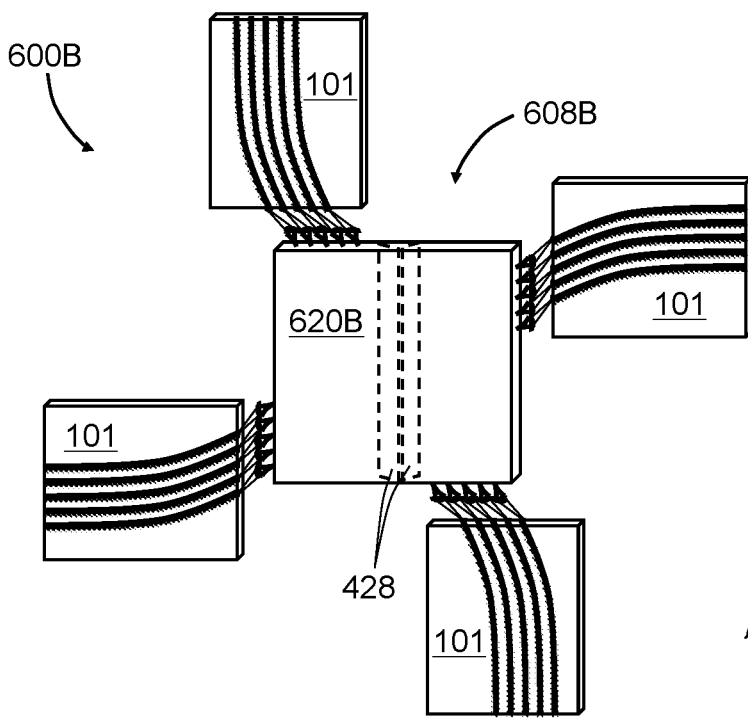
FIG. 6B is a plan view an illuminator with four SLED arrays of FIG. 4 coupled to a waveguide coupler including integrated reflectors.

Turning to FIG. 6B, an illuminator 600B is a variant of the illuminator 600A of FIG. 6A. The illuminator 600B of FIG. 6B includes not two but four SLED arrays 101 coupled to a waveguide coupler 608B on all four sides as shown. The waveguide coupler 608B is equivalent to four waveguide couplers 408 of FIG. 4 integrated on a common substrate 620B. The waveguide coupler 608B of FIG. 6B includes corresponding arrays of waveguides, not shown, and a plurality of tilted reflectors, e.g. two tilted reflectors 428 as shown, three, four, or more reflectors, e.g. different reflectors for different waveguides. The waveguides of the waveguide coupler 608B may extend between the corresponding end facets of the substrate 620B and the tilted reflectors 428. The waveguide may have different length, radiae of curvature (if curved), etc.

Figure 7A:
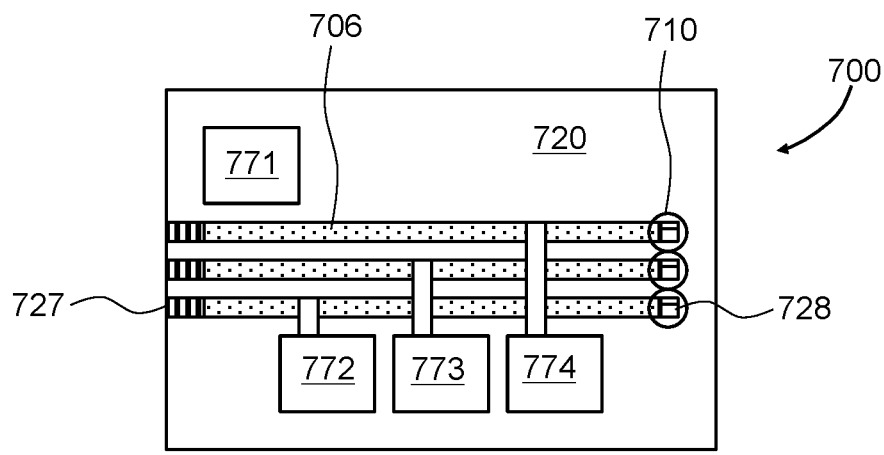
FIG. 7A is a top view of a SLED array having an integrated Bragg reflector for redirecting light out of a top surface of the SLED array.
Figure 7B:
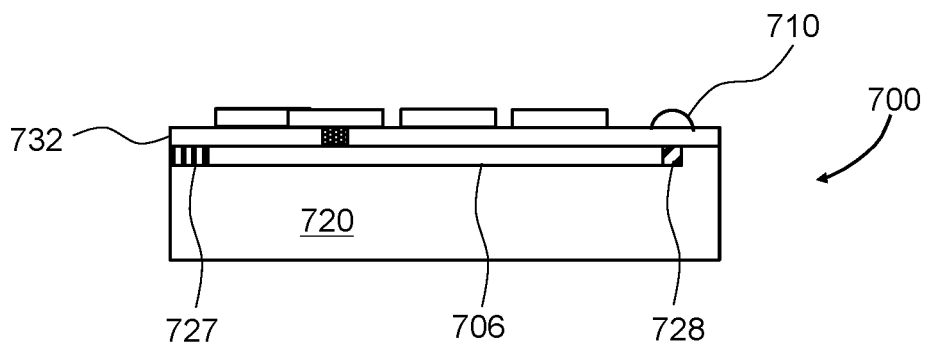
FIG. 7B is a side cross-sectional view of the SLED array of FIG. 7A.

Referring to FIGS. 7A and 7B, a semiconductor light source 700 includes a substrate 720 and an array p-n junction waveguides 706 supported by the substrate 720. Each p-n junction waveguide 706 terminates with a straight Bragg end reflector 727 on one end and with a tilted Bragg end reflector 728 of the other end, both supported by the substrate and optically coupled to the p-n junction waveguide 706. A separate reflective layer and/or an embedded diffractive optical element may be used instead of the tilted Bragg reflector 728. A top layer 732 may be provided over the p-n junction waveguides 706, the array of straight Bragg end reflectors 727, and the array of tilted Bragg end reflectors 728. Electrodes 771, 772, 773, 774 may be provided for independently applying a direct current to the p-n junction waveguide 706 to generate superluminescence light, which is guided by the p-n junction waveguides 706. The straight Bragg end reflectors 727 are configured for retroreflecting the superluminescence light towards the corresponding tilted Bragg end reflectors 728, which are configured for directing the superluminescent light towards the top layer 732, i.e. towards the top surface of the substrate 720 and the semiconductor light source 700. In other words, the straight 727 and tilted 728 Bragg end reflectors form SLED structures.

In some embodiments, the straight 727 and tilted 728 Bragg end reflectors may form laser diode structures, with the tilted Bragg end reflectors 728 being configured to retroreflect a portion of light 702 back into the p-n junction waveguides 706 towards the straight Bragg end reflectors 727, to form lasing cavities. At the same time, a portion of the light 702 may be reflected back to the straight Bragg end reflectors 727. Other types of tilted reflectors may be used in place of the straight Bragg end reflectors 727 and/or the tilted Bragg end reflectors 728, e.g. reflective surfaces, reflective layers, mirrors attached to a tilted end facet (not shown), etc. Furthermore, various straight and/or tilted end reflectors may be combined into a single end reflector extending across some or all p-n junction waveguides 706.

Figure 8:
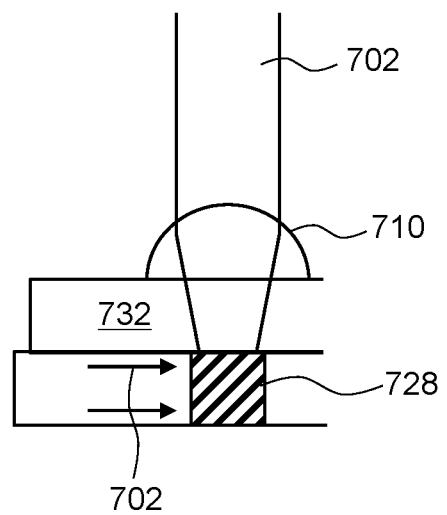
FIG. 8 is an enlarged view of FIG. 7B showing the integrated Bragg reflector.

An array of microlenses 710 or other type of couplers may be disposed on the top layer 732 may collimate the directed the superluminescent light. The latter point is illustrated in FIG. 8, which shows the light 702 directed upwards by the tilted Bragg end reflectors 728. The light 702 then propagates through the top layer 732, and is collimated by one of the microlenses 710. The microlenses 710 may also be spaced apart from the top layer 732. For example, the microlenses 710 may be held with holders, not shown. The focal lengths of the microlenses 710 and their separation from the top layer 732 may be selected so as to provide a required size and location of the beam waists of the light 702.

Figure 9:
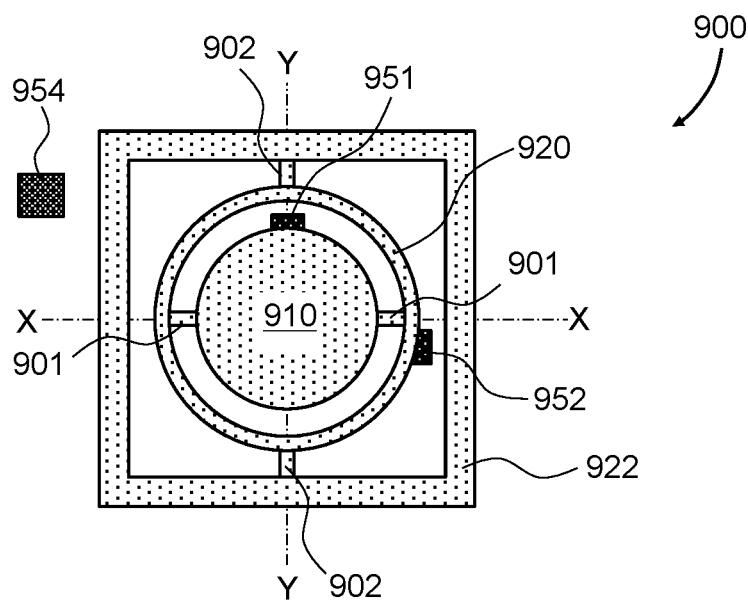
FIG. 9 is a plan view of a 2D tiltable microelectromechanical (MEMS) reflector in accordance with the present disclosure.

Referring to FIG. 9, a two-dimensional (2D) tiltable microelectromechanical system (MEMS) reflector 900 includes a tiltable reflector 910 supported by a pair of first torsional hinges 901 allowing tilting the tiltable reflector 910 about X axis. The first torsional hinges 901 extend from the tiltable reflector 910 to a gimbal ring 920, which is supported by a pair of second torsional hinges 902 extending from the gimbal ring 920 to a fixed base 922, for tilting of the gimbal ring 920 and the tiltable reflector 910 about Y axis. Actuators, e.g. electrostatic, electromagnetic, and/or piezo actuators, may be disposed underneath the tiltable reflector 910 and/or the gimbal ring 920 for providing a force for actuating the tilt of the tiltable reflector 910 about X and Y axes. For example, in the embodiment shown in FIG. 9, a first actuator 951 may be disposed under an edge of the tiltable reflector 910 to tilt the tiltable reflector 910 about X-axis. A second actuator 952 may be disposed under the gimbal ring 920 for tilting the gimbal ring 920 and the tiltable reflector 910 about Y-axis.

A feedback circuit 954 may be provided for determining the X- and Y-angles of tilt of the tiltable reflector 910. The feedback circuit 954 may measure electric capacitance between the first electrostatic actuator 951 and the tiltable reflector 910 to determine the X-tilt, and electric capacitance between the second electrostatic actuator 952 and the gimbal ring 920 to determine the Y-tilt. Separate electrodes may also be provided specifically for the feedback circuit 954. In some embodiments, the feedback circuit 954 may provide a sync or triggering pulses when the tiltable reflector 910 is tilted at a certain X- and/or Y-angle.

Figure 10A:
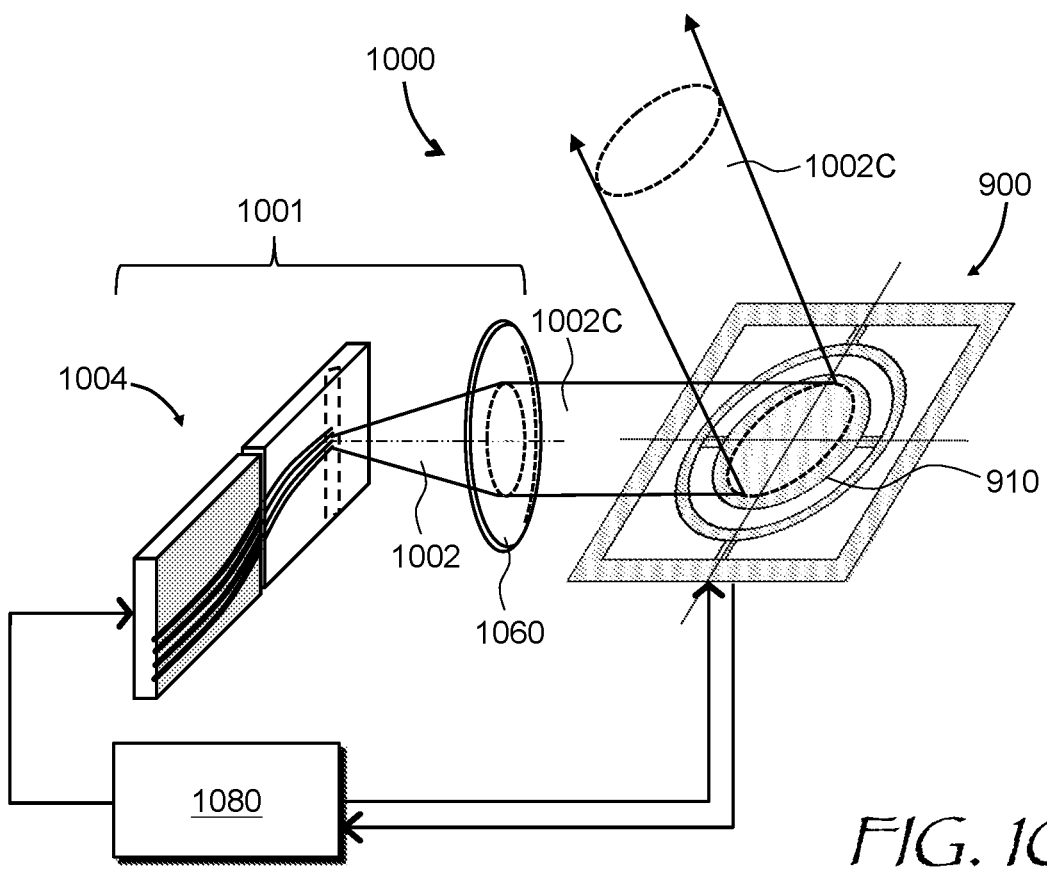
FIG. 10A is a schematic view of a projector including the light source of FIG. 4 and the 2D tiltable MEMS reflector of FIG. 9.

Referring to FIG. 10A, a projector 1000 for a near-eye display comprises an illuminator 1001 including a light source assembly 1004 and a collimator 1060. The light source assembly 1004 may include a semiconductor light source and a waveguide coupler, for example the semiconductor light source 700 of FIGS. 7A and 7B; or the side-emitting semiconductor light source 101 and the waveguide coupler 108 of FIG. 1, the waveguide coupler 208 of FIG. 2, the waveguide coupler 308 of FIG. 3, the waveguide coupler 408 of FIG. 4, the waveguide coupler 508 of FIG. 5, or the waveguide coupler 608 of FIG. 6. The projector 1000 further includes a beam scanner, e.g. the 2D tiltable MEMS reflector 900 of FIG. 9, optically coupled to the illuminator 1001, and a controller 1080 operably coupled to the light source assembly 1004 and the 2D tiltable MEMS reflector 900.

A semiconductor light source of the light source assembly 1004 may include a substrate, e.g. a semiconductor chip substrate, supporting an array of SLEDs, for providing the plurality of light beams 1002 at an end facet of the substrate. The collimator 1060, e.g. a bulk lens, a Fresnel lens, a diffractive lens or optical element, a concave mirror, a phase plate, a freeform optical element, etc., is optically coupled to the light source assembly 1004 to collimate the plurality of light beams 1002 emitted by the light source assembly 1004, forming a collimated light beam 1002C. The tiltable reflector 910 of the MEMS mirror 900 is optically coupled to the collimator 1060 for receiving and scanning the collimated light beam 1002C about X and Y axes.

In some implementations, the 2D tiltable MEMS reflector 900 includes a 1D scanning mirror or a diffractive reflector. A linear array of light sources may be used to provide a plurality of image pixels in a direction perpendicular to the direction of scanning. In some embodiments, the 2D tiltable MEMS reflector 900 may be replaced with two 1D scanning mirrors, one for scanning about X axis, and the other for scanning about Y axis. The two 1D scanning mirrors may be coupled via a pupil relay optic.

The controller 1080 may be configured to energize individual SLEDs of the light source assembly 1004 in coordination with tilting the 2D tiltable MEMS reflector 900 to provide an image in angular domain. When viewed by a human eye, the image in angular domain is projected by the eye's cornea and retina to become a spatial-domain image on the eye's retina.

Figure 10B:
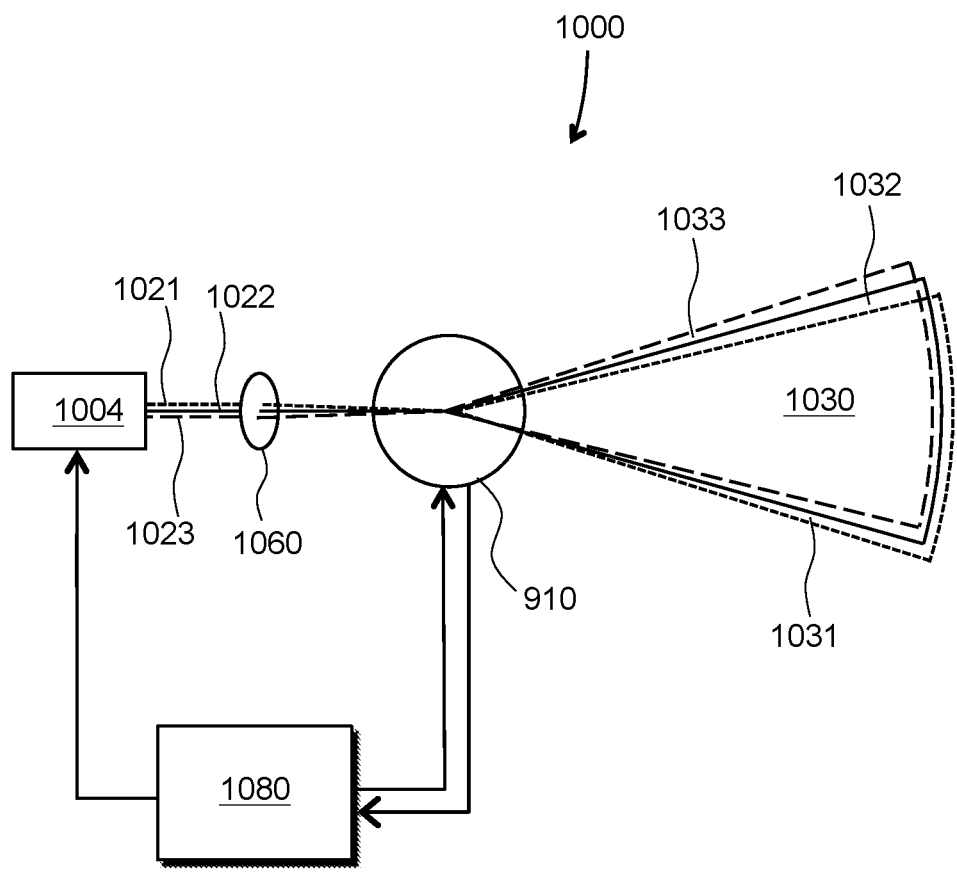
FIG. 10B is a schematic top view of the projector of FIG. 10A illustrating a relationship between fields of view provided by individual emitters of the projector's light source.

The operation of the projector 1000 is further illustrated in FIG. 10B. In this example, the light source assembly 1004 includes three emitters emitting three parallel diverging beams (only chief rays shown) 1021 (dotted lines), 1022 (solid lines), and 1023 (dashed lines). The collimator 1060 collimates the beams 1021, 1022, and 1023. By selecting suitable geometry, the collimator 1060 may also function to cause the collimated beams 1021, 1022, and 1023 to impinge onto a center of the tiltable reflector 910, e.g. a mirror or a diffractive reflector, for scanning all three beams 1021, 1022, and 1023. Since the angles of incidence of the beams 1021, 1022, and 1023 onto the tiltable reflector 910 are different, respective scanning areas 1031 (dotted lines), 1032 (solid lines), and 1033 (dashed lines) of the beams 1021, 1022, and 1023 are mutually offset as shown. The controller 1080 may take these offsets into account by providing corresponding delays to the driving signals of the three emitters of the light source assembly 1004. Offsets may be provided such as to effectively tripe the spatial resolution of the projector 1000 in a common scan area 1030 as compared to a case of a single emitter.

Figure 11:
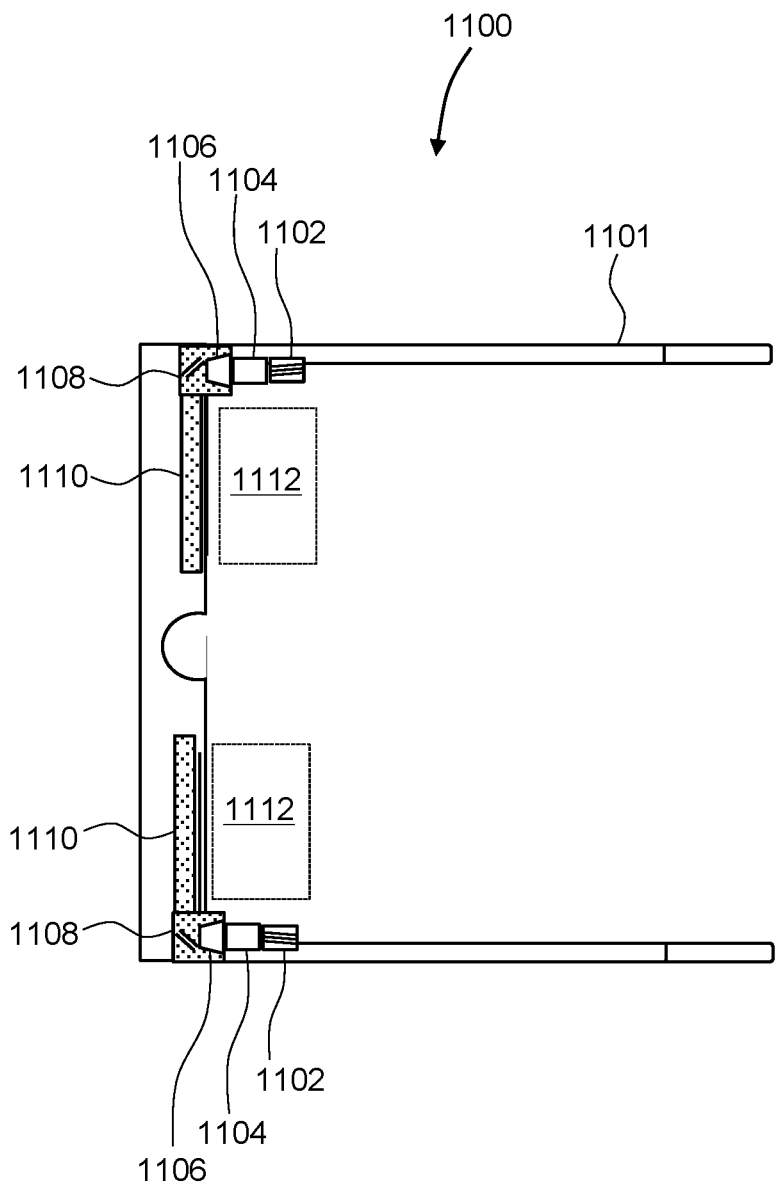
FIG. 11 is a schematic top view of a near-eye display including a projector described herein.

Turning to FIG. 11, a near-eye display 1100 of this disclosure includes a frame 1101 having a sunglasses form factor. The frame 1101 supports, for each eye: a light source subassembly 1102, a waveguide coupler 1104 optically coupled to the light source subassembly 1102, a collimator 1106 optically coupled to the waveguide coupler 1104, a tiltable reflector 1108 optically coupled to the collimator 1106, and a pupil replicator 1110 optically coupled to the tiltable reflector 1108. The light source subassembly 1102 may include a substrate supporting a plurality of semiconductor light sources, e.g. SLEDs, for providing a plurality of light beams. The waveguide coupler 1104 may include a plurality of waveguides extending between two end facets, for receiving and guiding the plurality of light beams in the plurality of waveguides, as described above. The light source subassembly 1102 and the waveguide coupler 1104 may include any solid-state light sources and waveguide couplers described herein, for example the semiconductor light source 700 of FIGS. 7A and 7B; or the side-emitting semiconductor light source 101 and the waveguide coupler 108 of FIG. 1, the waveguide coupler 208 of FIG. 2, the waveguide coupler 308 of FIG. 3, the waveguide coupler 408 of FIG. 4, the waveguide coupler 508 of FIG. 5, or the waveguide coupler 608 of FIG. 6, etc.

The collimator 1106 may be based on a concave mirror, a bulk lens, a Fresnel lens, a holographic lens, phase plate, etc., and may be integrated with the light source subassembly 1102 and the waveguide coupler 1104. The tiltable reflector 1108 may include the 2D tiltable MEMS reflector 900 of FIGS. 9 and 10A, for example, or a pair of 1D tiltable reflectors optically coupled via a pupil relay. The function of the pupil replicator 1110 is to provide multiple laterally offset copies of the light beams redirected or scanned by the tiltable reflector 1108 at an eyebox 1112.

Embodiments of the present disclosure may include, or be implemented in conjunction with, an artificial reality system. An artificial reality system adjusts sensory information about outside world obtained through the senses such as visual information, audio, touch (somatosensation) information, acceleration, balance, etc., in some manner before presentation to a user. By way of non-limiting examples, artificial reality may include virtual reality (VR), augmented reality (AR), mixed reality (MR), hybrid reality, or some combination and/or derivatives thereof. Artificial reality content may include entirely generated content or generated content combined with captured (e.g., real-world) content. The artificial reality content may include video, audio, somatic or haptic feedback, or some combination thereof. Any of this content may be presented in a single channel or in multiple channels, such as in a stereo video that produces a three-dimensional effect to the viewer. Furthermore, in some embodiments, artificial reality may also be associated with applications, products, accessories, services, or some combination thereof, that are used to, for example, create content in artificial reality and/or are otherwise used in (e.g., perform activities in) artificial reality. The artificial reality system that provides the artificial reality content may be implemented on various platforms, including a wearable display such as an HMD connected to a host computer system, a standalone HMD, a near-eye display having a form factor of eyeglasses, a mobile device or computing system, or any other hardware platform capable of providing artificial reality content to one or more viewers.

Figure 12A:
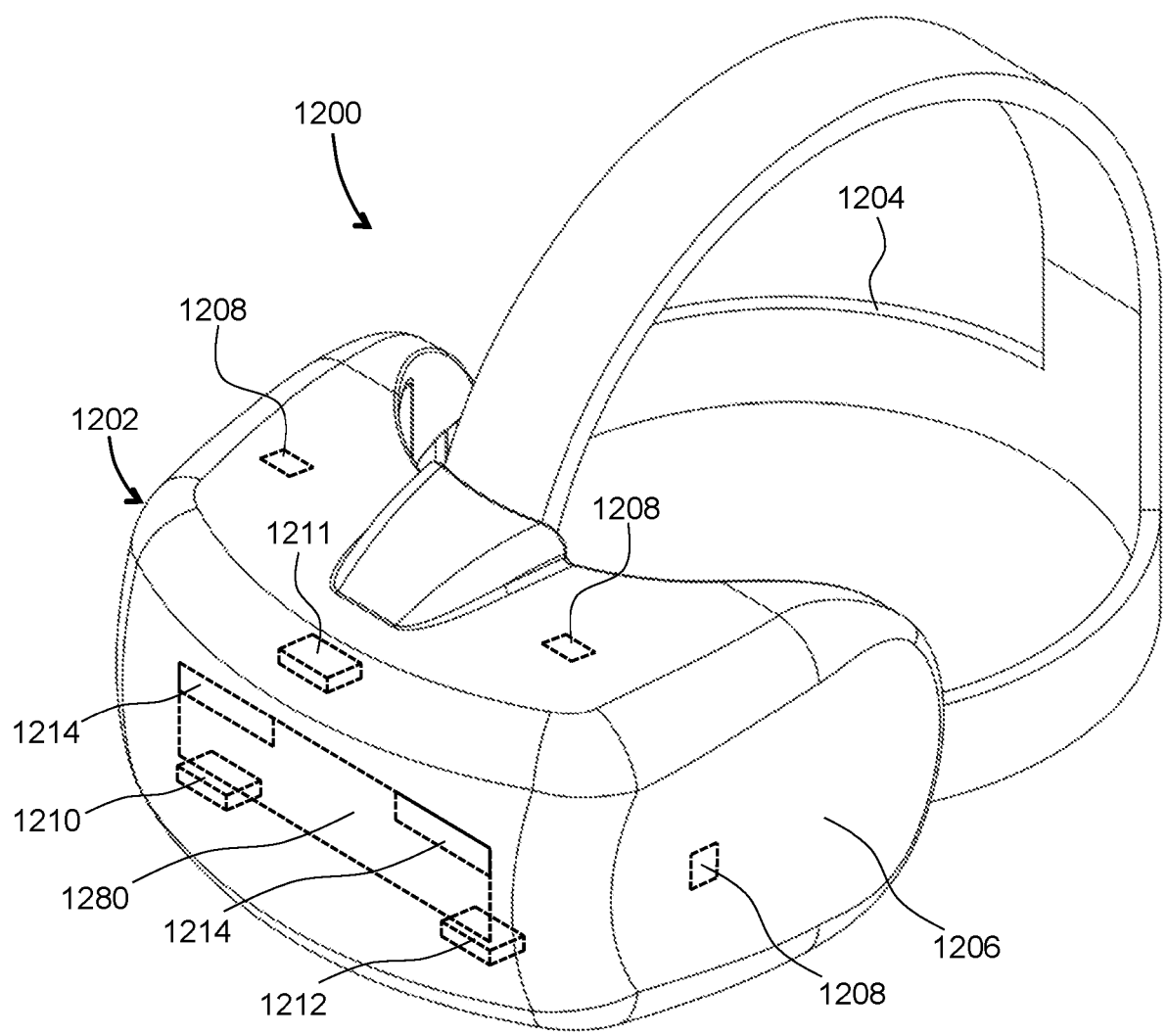
FIG. 12A is an isometric view of a head-mounted display of the present disclosure.

Referring to FIG. 12A, an HMD 1200 is an example of an AR/VR wearable display system which encloses the user's face, for a greater degree of immersion into the AR/VR environment. The HMD 1200 may include light sources, illuminators, and/or projectors disclosed herein. The function of the HMD 1200 is to augment views of a physical, real-world environment with computer-generated imagery, and/or to generate the entirely virtual 3D imagery. The HMD 1200 may include a front body 1202 and a band 1204. The front body 1202 is configured for placement in front of eyes of a user in a reliable and comfortable manner, and the band 1204 may be stretched to secure the front body 1202 on the user's head. A display system 1280 may be disposed in the front body 1202 for presenting AR/VR imagery to the user. Sides 1206 of the front body 1202 may be opaque or transparent.

In some embodiments, the front body 1202 includes locators 1208 and an inertial measurement unit (IMU) 1210 for tracking acceleration of the HMD 1200, and position sensors 1212 for tracking position of the HMD 1200. The IMU 1210 is an electronic device that generates data indicating a position of the HMD 1200 based on measurement signals received from one or more of position sensors 1212, which generate one or more measurement signals in response to motion of the HMD 1200. Examples of position sensors 1212 include: one or more accelerometers, one or more gyroscopes, one or more magnetometers, another suitable type of sensor that detects motion, a type of sensor used for error correction of the IMU 1210, or some combination thereof. The position sensors 1212 may be located external to the IMU 1210, internal to the IMU 1210, or some combination thereof.

The locators 1208 are traced by an external imaging device of a virtual reality system, such that the virtual reality system can track the location and orientation of the entire HMD 1200. Information generated by the IMU 1210 and the position sensors 1212 may be compared with the position and orientation obtained by tracking the locators 1208, for improved tracking accuracy of position and orientation of the HMD 1200. Accurate position and orientation is important for presenting appropriate virtual scenery to the user as the latter moves and turns in 3D space.

The HMD 1200 may further include a depth camera assembly (DCA) 1211, which captures data describing depth information of a local area surrounding some or all of the HMD 1200. To that end, the DCA 1211 may include a laser radar (LIDAR), or a similar device. The depth information may be compared with the information from the IMU 1210, for better accuracy of determination of position and orientation of the HMD 1200 in 3D space.

The HMD 1200 may further include an eye tracking system 1214 for determining orientation and position of user's eyes in real time. The obtained position and orientation of the eyes also allows the HMD 1200 to determine the gaze direction of the user and to adjust the image generated by the display system 1280 accordingly. In one embodiment, the vergence, that is, the convergence angle of the user's eyes gaze, is determined. The determined gaze direction and vergence angle may also be used for real-time compensation of visual artifacts dependent on the angle of view and eye position. Furthermore, the determined vergence and gaze angles may be used for interaction with the user, highlighting objects, bringing objects to the foreground, creating additional objects or pointers, etc. An audio system may also be provided including e.g. a set of small speakers built into the front body 1202.

Figure 12B:
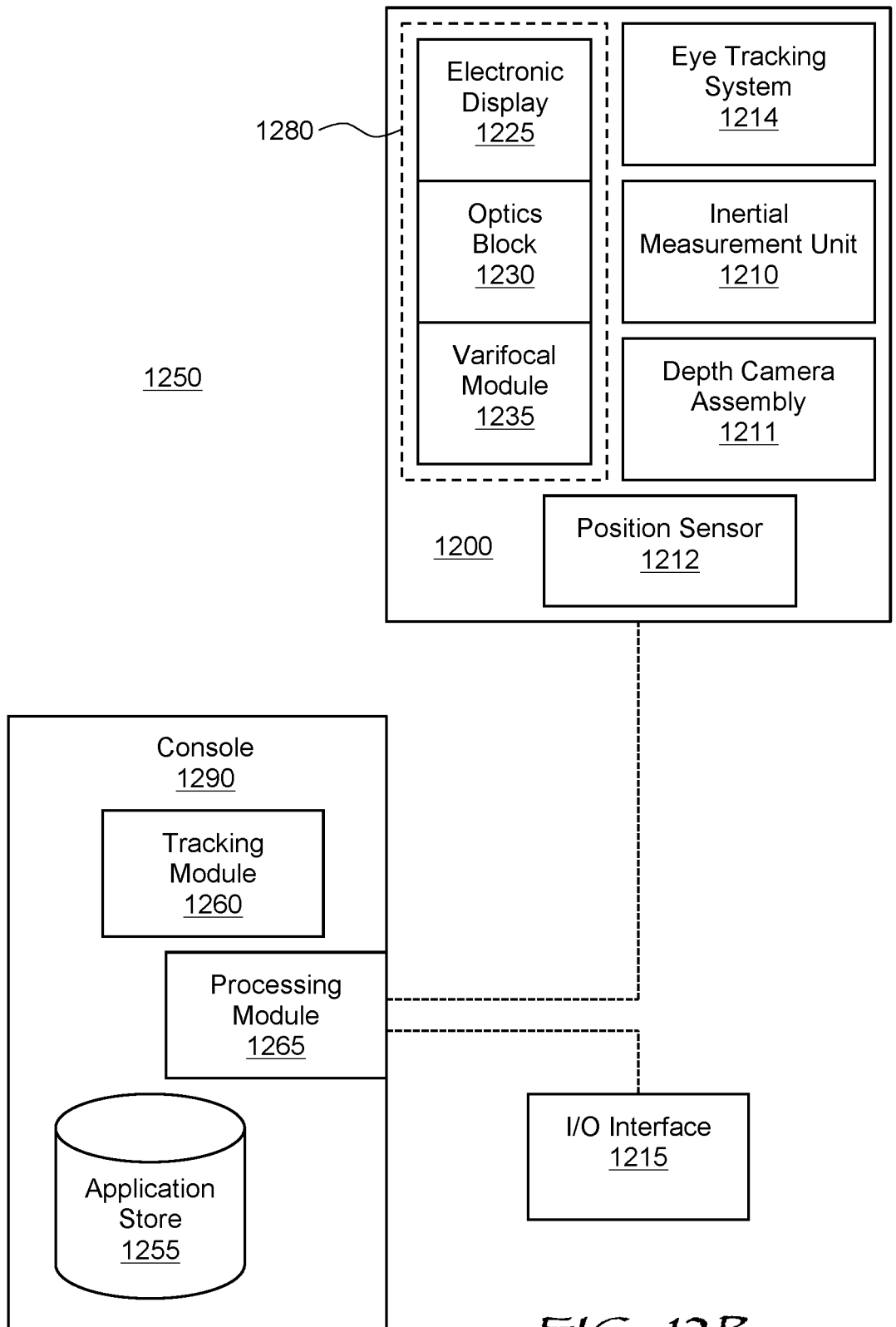
FIG. 12B is a block diagram of a virtual reality system including the headset of FIG. 12A.

Referring to FIG. 12B, an AR/VR system 1250 may include light sources and projector displays disclosed herein. The AR/VR system 1250 includes the HMD 1200 of FIG. 12A, an external console 1290 storing various AR/VR applications, setup and calibration procedures, 3D videos, etc., and an input/output (I/O) interface 1215 for operating the console 1290 and/or interacting with the AR/VR environment. The HMD 1200 may be "tethered" to the console 1290 with a physical cable, or connected to the console 1290 via a wireless communication link such as Bluetooth®, Wi-Fi, etc. There may be multiple HMDs 1200, each having an associated I/O interface 1215, with each HMD 1200 and I/O interface(s) 1215 communicating with the console 1290. In alternative configurations, different and/or additional components may be included in the AR/VR system 1250. Additionally, functionality described in conjunction with one or more of the components shown in FIGS. 12A and 12B may be distributed among the components in a different manner than described in conjunction with FIGS. 12A and 12B in some embodiments. For example, some or all of the functionality of the console 1290 may be provided by the HMD 1200, and vice versa. The HMD 1200 may be provided with a processing module capable of achieving such functionality.

As described above with reference to FIG. 12A, the HMD 1200 may include the eye tracking system 1214 (FIG. 12B) for tracking eye position and orientation, determining gaze angle and convergence angle, etc., the IMU 1210 for determining position and orientation of the HMD 1200 in 3D space, the DCA 1211 for capturing the outside environment, the position sensor 1212 for independently determining the position of the HMD 1200, and the display system 1280 for displaying AR/VR content to the user. The display system 1280 includes (FIG. 12B) an electronic display 1225, for example and without limitation, a liquid crystal display (LCD), an organic light emitting display (OLED), an inorganic light emitting display (ILED), an active-matrix organic light-emitting diode (AMOLED) display, a transparent organic light emitting diode (TOLED) display, a projector, or a combination thereof.

The display system 1280 further includes an optics block 1230, whose function is to convey the images generated by the electronic display 1225 to the user's eye. The optics block may include various lenses, e.g. a refractive lens, a Fresnel lens, a diffractive lens, an active or passive Pancharatnam—Berry phase (PBP) lens, a liquid lens, a liquid crystal lens, etc., a pupil-replicating waveguide, grating structures, coatings, etc. The display system 1280 may further include a varifocal module 1235, which may be a part of the optics block 1230. The function of the varifocal module 1235 is to adjust the focus of the optics block 1230 e.g. to compensate for vergence-accommodation conflict, to correct for vision defects of a particular user, to offset aberrations of the optics block 1230, etc.

The I/O interface 1215 is a device that allows a user to send action requests and receive responses from the console 1290. An action request is a request to perform a particular action. For example, an action request may be an instruction to start or end capture of image or video data or an instruction to perform a particular action within an application. The I/O interface 1215 may include one or more input devices, such as a keyboard, a mouse, a game controller, or any other suitable device for receiving action requests and communicating the action requests to the console 1290. An action request received by the I/O interface 1215 is communicated to the console 1290, which performs an action corresponding to the action request. In some embodiments, the I/O interface 1215 includes an IMU that captures calibration data indicating an estimated position of the I/O interface 1215 relative to an initial position of the I/O interface 1215. In some embodiments, the I/O interface 1215 may provide haptic feedback to the user in accordance with instructions received from the console 1290. For example, haptic feedback can be provided when an action request is received, or the console 1290 communicates instructions to the I/O interface 1215 causing the I/O interface 1215 to generate haptic feedback when the console 1290 performs an action.

The console 1290 may provide content to the HMD 1200 for processing in accordance with information received from one or more of: the IMU 1210, the DCA 1211, the eye tracking system 1214, and the I/O interface 1215. In the example shown in FIG. 12B, the console 1290 includes an application store 1255, a tracking module 1260, and a processing module 1265. Some embodiments of the console 1290 may have different modules or components than those described in conjunction with FIG. 12B. Similarly, the functions further described below may be distributed among components of the console 1290 in a different manner than described in conjunction with FIGS. 12A and 12B.

The application store 1255 may store one or more applications for execution by the console 1290. An application is a group of instructions that, when executed by a processor, generates content for presentation to the user. Content generated by an application may be in response to inputs received from the user via movement of the HMD 1200 or the I/O interface 1215. Examples of applications include: gaming applications, presentation and conferencing applications, video playback applications, or other suitable applications.

The tracking module 1260 may calibrate the AR/VR system 1250 using one or more calibration parameters and may adjust one or more calibration parameters to reduce error in determination of the position of the HMD 1200 or the I/O interface 1215. Calibration performed by the tracking module 1260 also accounts for information received from the IMU 1210 in the HMD 1200 and/or an IMU included in the I/O interface 1215, if any. Additionally, if tracking of the HMD 1200 is lost, the tracking module 1260 may re-calibrate some or all of the AR/VR system 1250.

The tracking module 1260 may track movements of the HMD 1200 or of the I/O interface 1215, the IMU 1210, or some combination thereof. For example, the tracking module 1260 may determine a position of a reference point of the HMD 1200 in a mapping of a local area based on information from the HMD 1200. The tracking module 1260 may also determine positions of the reference point of the HMD 1200 or a reference point of the I/O interface 1215 using data indicating a position of the HMD 1200 from the IMU 1210 or using data indicating a position of the I/O interface 1215 from an IMU included in the I/O interface 1215, respectively. Furthermore, in some embodiments, the tracking module 1260 may use portions of data indicating a position or the HMD 1200 from the IMU 1210 as well as representations of the local area from the DCA 1211 to predict a future location of the HMD 1200. The tracking module 1260 provides the estimated or predicted future position of the HMD 1200 or the I/O interface 1215 to the processing module 1265.

The processing module 1265 may generate a 3D mapping of the area surrounding some or all of the HMD 1200 ("local area") based on information received from the HMD 1200. In some embodiments, the processing module 1265 determines depth information for the 3D mapping of the local area based on information received from the DCA 1211 that is relevant for techniques used in computing depth. In various embodiments, the processing module 1265 may use the depth information to update a model of the local area and generate content based in part on the updated model.

The processing module 1265 executes applications within the AR/VR system 1250 and receives position information, acceleration information, velocity information, predicted future positions, or some combination thereof, of the HMD 1200 from the tracking module 1260. Based on the received information, the processing module 1265 determines content to provide to the HMD 1200 for presentation to the user. For example, if the received information indicates that the user has looked to the left, the processing module 1265 generates content for the HMD 1200 that mirrors the user's movement in a virtual environment or in an environment augmenting the local area with additional content. Additionally, the processing module 1265 performs an action within an application executing on the console 1290 in response to an action request received from the I/O interface 1215 and provides feedback to the user that the action was performed. The provided feedback may be visual or audible feedback via the HMD 1200 or haptic feedback via the I/O interface 1215.

In some embodiments, based on the eye tracking information (e.g., orientation of the user's eyes) received from the eye tracking system 1214, the processing module 1265 determines resolution of the content provided to the HMD 1200 for presentation to the user on the electronic display 1225. The processing module 1265 may provide the content to the HMD 1200 having a maximum pixel resolution on the electronic display 1225 in a foveal region of the user's gaze. The processing module 1265 may provide a lower pixel resolution in other regions of the electronic display 1225, thus lessening power consumption of the AR/VR system 1250 and saving computing resources of the console 1290 without compromising a visual experience of the user. In some embodiments, the processing module 1265 can further use the eye tracking information to adjust where objects are displayed on the electronic display 1225 to prevent vergence-accommodation conflict and/or to offset optical distortions and aberrations.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

The present disclosure is not to be limited in scope by the specific embodiments described herein. Indeed, other various embodiments and modifications, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A waveguide coupler comprising:
   a substrate comprising an end facet and a surface;
   at least one tilted mirror supported by the substrate; and
   a plurality of waveguides supported by the substrate and extending between the end facet and the at least one tilted mirror, wherein each waveguide of the plurality of waveguides has a first propagation mode at the end facet smaller than a second propagation mode at the at least one tilted mirror;
   wherein the at least one tilted mirror is configured to redirect light propagating in the plurality of waveguides to the surface of the substrate.

2. The waveguide coupler of claim 1, wherein the at least one tilted mirror is integrated into the substrate.

3. The waveguide coupler of claim 1, wherein the at least one tilted mirror is coupled to a slanted facet of the substrate.

4. The waveguide coupler of claim 1, further comprising at least one of:
- a plurality of output couplers supported by the surface of the substrate, each for collimating light propagated in a waveguide of the plurality of waveguides and redirected by the at least one tilted mirror; or
- a plurality of input couplers at the end facet of the substrate, each for coupling light into a waveguide of the plurality of waveguides.

5. The waveguide coupler of claim 1, wherein the first propagation mode has an ellipticity larger than an ellipticity of the second propagation mode.

6. The waveguide coupler of claim 1, further comprising a waveguide section coupled to a first waveguide of the plurality of waveguides via an evanescent coupling region for out-coupling a portion of light from the first waveguide into the waveguide section.

7. The waveguide coupler of claim 6, further comprising a ring resonator, wherein the waveguide section is a part of the ring resonator, and an electrode disposed proximate the coupling region for changing the portion of light outcoupled from the first waveguide into the ring resonator.

8. An illuminator comprising:
- a light source subassembly comprising a first substrate supporting a plurality of semiconductor light sources for providing a plurality of light beams emitted at a first end facet of the first substrate; and
- a waveguide coupler optically coupled to the light source subassembly and comprising:
  - a second substrate comprising a second end facet and a surface;
  - at least one tilted mirror supported by the second substrate; and
  - a plurality of waveguides extending between the second end facet and the at least one tilted mirror, wherein each waveguide of the plurality of waveguides is configured for receiving and guiding therein a light beam of the plurality of light beams at the second end facet; and
  - wherein the at least one tilted mirror is configured to redirect the light beams propagated in the plurality of waveguides to the surface of the second substrate.

9. The illuminator of claim 8, wherein the at least one tilted mirror is integrated into the second substrate.

10. The illuminator of claim 8, wherein each semiconductor light source of the plurality of semiconductor light sources comprises at least one of: a single-mode source, a multimode source, or a stimulated emissive source.

11. The illuminator of claim 10, wherein each semiconductor light source of the plurality of semiconductor light sources comprises at least one of: a superluminescent light-emitting diode, a laser diode, a vertical-cavity surface-emitting laser diode, or a light-emitting diode.

12. The illuminator of claim 8, further comprising at least one of:
- a plurality of output couplers supported by the surface of the second substrate, each for collimating a light beam of the plurality of light beams propagated in a waveguide of the plurality of waveguides and redirected by the at least one tilted mirror; or
- a plurality of input couplers at the second end facet, each for coupling a light beam of the plurality of light beams emitted by a semiconductor light source into a waveguide of the plurality of waveguides.

13. The illuminator of claim 8, further comprising a collimator optically coupled to the waveguide coupler and configured for receiving and collimating the plurality of light beams.

14. The illuminator of claim 13, further comprising a tiltable MEMS optically coupled to the collimator and configured for receiving and redirecting the plurality of light beams collimated by the collimator.

* * * * *